United States Patent
Sakai et al.

(10) Patent No.: US 7,109,076 B2
(45) Date of Patent: Sep. 19, 2006

(54) METHOD OF MANUFACTURING SEMICONDUCTOR INTEGRATED CIRCUIT DEVICE, AND SEMICONDUCTOR INTEGRATED CIRCUIT DEVICE MADE BY ITS METHOD

(75) Inventors: Satoshi Sakai, Yokohama (JP); Daichi Matsumoto, Hamura (JP); Katsuyuki Asaka, Hamura (JP); Masatoshi Hasegawa, Hamura (JP); Kazutaka Mori, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/855,402

(22) Filed: May 28, 2004

(65) Prior Publication Data
US 2004/0259306 A1 Dec. 23, 2004

(30) Foreign Application Priority Data
Jun. 3, 2003 (JP) .............................. 2003-157737

(51) Int. Cl.
*H01L 21/336* (2006.01)
*H01L 21/8234* (2006.01)
*H01L 21/8238* (2006.01)

(52) U.S. Cl. ............... 438/197; 438/199; 257/E21.301; 257/E21.637

(58) Field of Classification Search ............... 438/197, 438/199, 200, 592, 655; 257/E21.301, E21–637, 257/E21.632, E21.201, E21.657, E21.507
See application file for complete search history.

(56) References Cited

U.S. PATENT DOCUMENTS

| 2002/0004263 A1* | 1/2002 | Tanabe et al. ............... 438/199 |
| 2003/0003639 A1* | 1/2003 | Kanda et al. ............... 438/197 |
| 2004/0104416 A1* | 6/2004 | Takaura et al. ............. 438/199 |

FOREIGN PATENT DOCUMENTS

| JP | 7-161826 | 6/1995 |
| JP | 9-260509 | 10/1997 |
| JP | 10-50857 | 2/1998 |
| JP | 11-195713 | 7/1999 |
| JP | 2001-24168 | 1/2001 |
| JP | 2001-210725 | 8/2001 |

\* cited by examiner

*Primary Examiner*—Walter L. Lindsay, Jr.
(74) *Attorney, Agent, or Firm*—Miles & Stockbridge P.C.

(57) ABSTRACT

Mutual diffusion of impurities in a gate electrode is suppressed near a boundary between an n-channel type MISFET and a p-channel type MISFET, which adopt a polycide's dual-gate structure. Since a gate electrode of an n-channel type MISFET and a gate electrode of a p-channel type MISFET are of mutually different conductivity types, they are separated to prevent the mutual diffusion of the impurities and are electrically connected to each other via a metallic wiring formed in the following steps. In a step before a gate electrode material is patterned to separate the gate electrodes, the mutual diffusion of the impurities before forming the gate electrodes is prevented by performing no heat treatment at a temperature of 700° C. or higher.

7 Claims, 22 Drawing Sheets

METHOD OF MANUFACTURING SEMICONDUCTOR INTEGRATED CIRCUIT DEVICE, AND SEMICONDUCTOR INTEGRATED CIRCUIT DEVICE MADE BY ITS METHOD

CROSS-REFERENCE TO RELATED APPLICATION

The present application claims priority from Japanese patent application No. JP 2003-157737 filed on Jun. 3, 2003, the content of which is hereby incorporated by reference into this application.

BACKGROUND OF THE INVENTION

The present invention relates to a technique for manufacturing a semiconductor integrated circuit device, and particularly to a technique effectively applied to manufacture of a semiconductor integrated circuit device having a so-called complementary MISFET with a dual-gate structure (Dual-gate type CMOSFET), in which a gate electrodes of n-channel type MISFET and a gate electrode of p-channel type MISFET are composed of silicon films of different conductivity types.

The semiconductor device in which a circuit is composed of a complementary MISFET has recently widely adopted a dual-gate structure in which a gate electrode of n-channel type MISFET is composed of an n-type poly-silicon film and a gate electrode of p-channel type MISFET is composed of a p-type poly-silicon film.

This is due to the following reason. Namely, in the case where both gate electrodes of n-channel type MISFET and p-channel type MISFET are composed of n-type poly-silicon films similarly to conventional semiconductor devices, the p-channel type MISFET has a buried channel structure and short channel effects become prominent at the time of miniaturizing the devices, so that it is necessary to adopt the dual-gate structure even if the number of steps is increased and to promote miniaturization of the devices by suppressing the short channel effects.

Japanese Patent Laid-Open No. 11-195713 (hereinafter "Patent Document 1"), Japanese Patent Laid-Open No. 9-260509 ("Patent Document 2"), and Japanese Patent Laid-Open No. 10-50857 ("Patent Document 3") teach a polycide's dual-gate structure in which the gate electrode of n-channel type MISFET is composed of a laminated film of an n-type poly-silicon film and a tungsten silicide film and the gate electrode of p-channel type MISFET is composed of a laminated film of a p-type poly-silicon film and a tungsten silicide film, and then disclose a technique in which respective impurities in the n-type poly-silicon film and the p-type poly-silicon film in the polycide dual-gate structure are prevented from performing mutual diffusion through the tungsten silicide film with large diffusion coefficient.

In Patent Document 1, the gate electrode of n-channel type MISFET and the gate electrode of p-channel type MISFET are separated on a field dielectric film, and a portion located above the field dielectric film and in an insulating film covering the gate electrodes is provided with a groove, and the above-mentioned gate electrodes are connected to each other through a conductive layer such as tungsten embedded in an inside of the groove. Meanwhile, also in Patent Documents 2 and 3, the gate electrodes are electrically connected to each other through a conductive layer located on the field dielectric film, but the n-type poly-silicon film and the p-type poly-silicon film are not separated and only the tungsten silicide film is separated on the field dielectric film.

Japanese Patent Laid-Open No. 7-161826 ("Patent Document 4") discloses a technique for preventing mutual diffusion of respective impurities in a p-type gate electrode and an n-type gate electrode in a CMOS device adopting a dual-gate structure. The forming method for a dual-gate electrode, as disclosed in this gazette, is such that a poly-silicon film is first deposited on a silicon substrate and an aperture is formed in the polysilicon film located on an isolation region and thereby the respective polysilicon films on a p well and an n well are separated from each other. Next, boron is ion-implanted into the polysilicon film located on the p well and arsenic is ion-implanted into the polysilicon film located on the n well, and thereafter a tungsten film is deposited on the entire surface of a substrate to connect the n-type polysilicon film and the p-type polysilicon film by the tungsten film.

In the n-type gate electrode and the p-type gate electrode that have been manufactured by the above-described method, the mutual diffusion of the impurities can be prevented since the n-type polysilicon film and the p-type polysilicon film are not in direct contact with each other.

Japanese Patent Laid-Open No. 2001-210725 ("Patent Document 5") discloses a semiconductor device of dual-gate structure in which a contact is formed in a boundary between an n-type gate electrode and a p-type gate electrode and a conductive material made of refractory metal or silicide thereof is buried in the contact.

According to the above-mentioned dual-gate structure, even when a high-resistance region is formed on the boundary between the n-type gate electrode and the p-type gate electrode owing to the mutual diffusion of the impurities, electric connection is maintained by the conductive material buried in the contact, so that circuit defect in which the electric connection between the gate electrodes is lost can be prevented.

Development of a SoC (System on Chip) in which an operation circuit, a memory circuit, a logic circuit, an analog circuit, and a RF circuit, etc. are integrated onto a single semiconductor chip has recently been promoted as a technique for realizing miniaturization and high performance of the system.

In the SoC, the above-described dual-gate structure is adopted to meet the needs of the higher performance of the system. Also, when a DRAM (Dynamic Random Access Memory) is mounted on a portion of the memory circuit, a polycide film in which a tungsten silicide film is laminated on an upper portion of a poly-silicon film is adopted as a low-resistance gate-electric material coping with a heat treatment performed at high temperature in forming a capacitor of a memory cell.

SUMMARY OF THE INVENTION

However, in the above-described polycide's dual-gate structure combining a dual-gate structure and a polycide gate structure, the impurities contained in the poly-silicon film constituting a portion of the gate electrode are mutually diffused through the upper tungsten silicide layer, and an impurity concentration in the gate electrode disposed near the boundary between the n-channel type MISFET and the p-channel type MISFET is degraded. Therefore, there arises the problem that threshold voltage and contact resistance between tungsten silicide and poly silicon are varied.

An object of the present invention is to provide a technique capable of suppressing the mutual diffusion of the impurities in the gate electrode disposed near the boundary between the n-channel type MISFET and the p-channel type MISFET adopting a polycide's dual-gate structure.

Another object of the present invention is to provide a technique capable of suppressing the mutual diffusion of the impurities in the gate electrode, as described above, and of minimizing an increases in a circuit area of a logic device with memory.

The above and other objects and novel features of the present invention will become apparent from the description of this specification and the accompanying drawings.

Outlines of representative ones of inventions disclosed in this application will be briefly described as follows.

A method of manufacturing a logic device with memory, which adopts a polycide's dual-gate structure., according to the present invention comprises the following steps of (a) to (e):

(a) forming a gate dielectric film over a main surface of said semiconductor substrate, and thereafter forming a silicon film over said gate dielectric film;

(b) introducing a plurality of kinds of impurities into said silicon film, and thereby forming a n-type silicon film in a first region of said semiconductor substrate and a p-type silicon film in a second thereof;

(c) forming, above each of said n-type silicon film and said p-type silicon film, a conductive film containing tungsten or tungsten silicide as a main component;

(d) patterning said conductive film, said n-type silicon film, and said p-type silicon film after said step (c), and thereby forming, in said first region, a gate electrode of n-channel type MISFET which is composed of a laminated film of said n-type silicon film and said conductive film, and forming, in said second region, a gate electrode of p-channel type MISFET which is composed of a laminated film of said p-type silicon film and said conductive film; and (e) performing a heat treatment of said semiconductor substrate at a temperature of 700° C. or higher after said step (d).

A method of manufacturing a logic device with memory, which adopts a polycide's dual-gate structure, according to the present invention comprises the following steps of (a) to (f):

(a) forming a first gate dielectric film, in a first region on a main surface of said semiconductor substrate, and forming a second gate dielectric film larger in thickness than said first gate dielectric film, in a second region over said main surface;

(b) forming a silicon film over said first and second gate dielectric films;

(c) introducing a plurality of kinds of impurities into said silicon film, and thereby forming a n-type silicon film and a p-type silicon film over said first gate dielectric film and an n-type silicon film over said second gate dielectric film;

(d) forming, above each of said n-type silicon film and said p-type silicon film, a conductive film containing tungsten or tungsten silicide as a main component;

(e) by patterning said conductive film, said n-type silicon film, and said p-type silicon film after said step (d), forming a gate electrode of a first n-channel type MISFET, which is composed of a laminated film of said n-type silicon film and said conductive film, over said first gate dielectric film, and a gate electrode of a first p-channel type MISFET, which is composed of a laminated film of said p-type silicon film and said conductive film, and forming, over said second gate dielectric film, a gate electrode of a second n-channel type MISFET, which is composed of a laminated film of said n-type silicon film and said conductive film, and a gate electrodes of a second p-channel type MISFET, which is composed of a laminated film of said n-type silicon film and said conductive film; and (f) performing a heat treatment of said semiconductor substrate at a temperature of 700° C. or higher after said step (e).

DESCRIPTION OF THE PREFERRED EMBODIMENTS

Hereinafter, an embodiment of the present invention will be detailed based on the drawings. Note that members having the same function are denoted by the same reference symbol throughout all the drawings for explaining the embodiment and the repetitive description thereof will be omitted.

Figure 1:
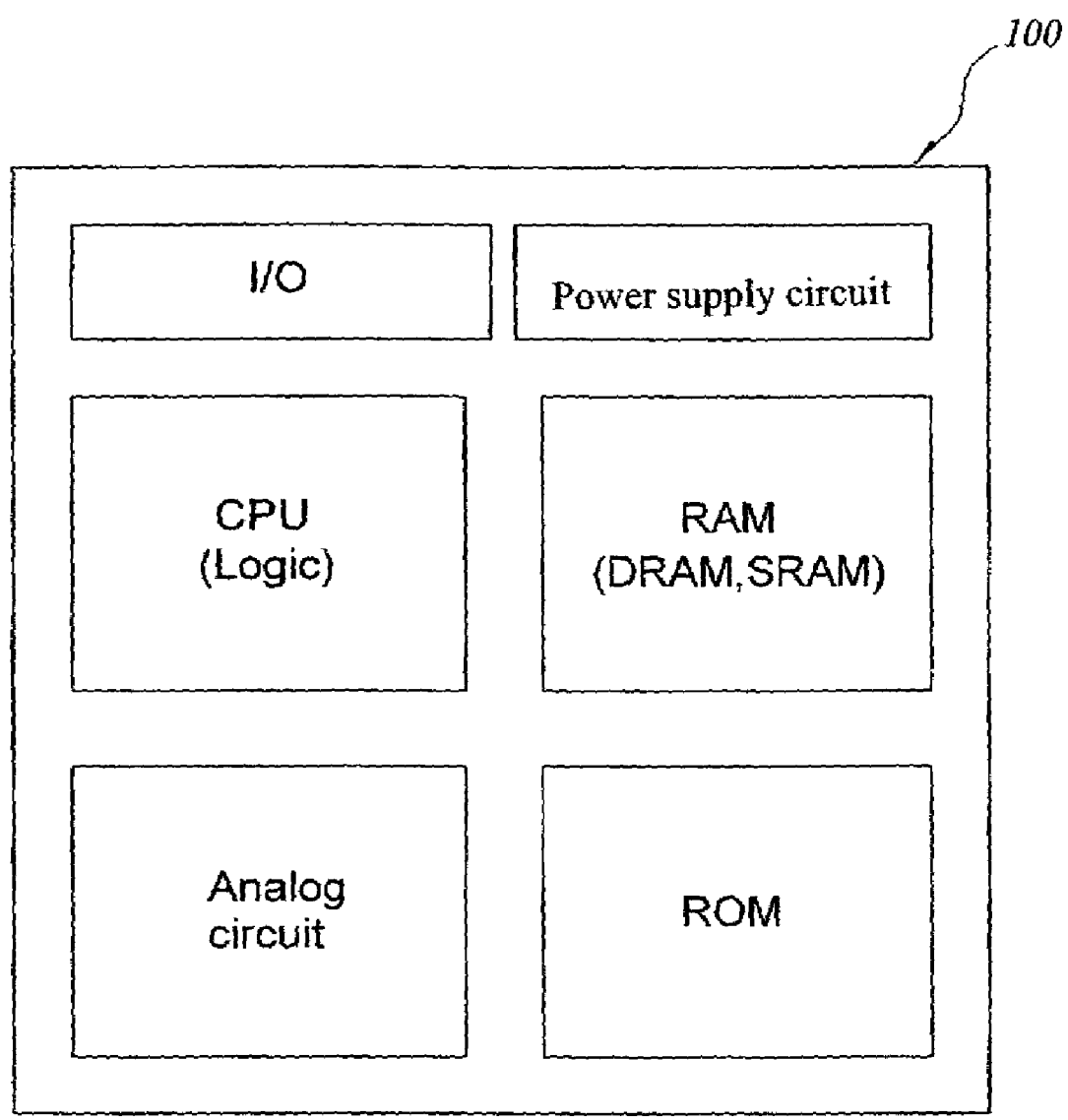
FIG. 1 is a plan view illustrating a circuit block configuration of a logic device with memory according to one embodiment of the present invention.

The present embodiment is one applied to a manufacturing process of a logic device with memory, in which a logic circuit such as a central processing unit (CPU) and an analog circuit, a memory circuit such as a DRAM, SRAM, or ROM, an input/output (I/O) circuit, and a power supply circuit are, for example, integrated onto a main surface of a single semiconductor chip 1A as illustrated in FIG. 1.

The logic circuit, the input/output (I/O) circuit, and the power circuit are configured by an n-channel type MISFET, a p-channel type MISFET, and wirings for connecting them.

In the memory circuit, the DRAM comprises: a memory array constituted by a plurality of memory cells; a memory array associate circuit (sense amplifier or sub word driver etc.) arranged on a periphery of the memory array and directly controlling the memory array; and a peripheral circuit controlling the memory array associate circuit.

Figure 2:
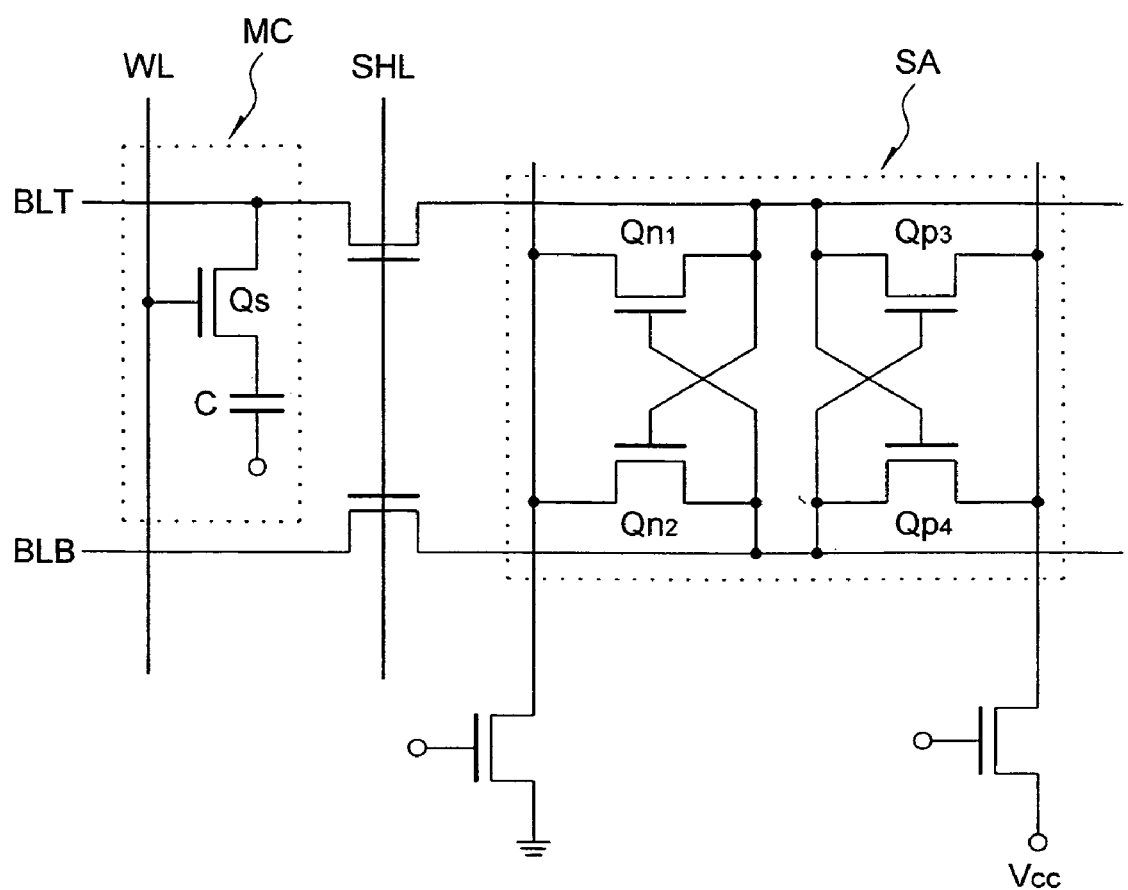
FIG. 2 is an equivalent circuit view of a memory cell and a sense amplifier of a DRAM, which is a portion of the logic device with memory as illustrated in FIG. 1.

As illustrated in FIG. 2, each memory cell (MC) of the DRAM comprises: an n-channel type selecting MISFET (Qs) disposed at an intersection between a bit-line pair (BLT and BLB); and a capacitor (C) serially connected to the selecting MISFET (Qs). A sense amplifier (SA) is disposed in a bit-line direction of the memory array, and a sub word driver (not shown) is disposed in a word-line direction. The memory array associate circuit including the sense amplifier (SA) and the sub word driver and the peripheral circuit, such as an input/output circuit and a power supply circuit, for controlling the memory array associate circuit is composed of the n-channel type MISFETs and the p-channel type MISFETs, respectively. For example, the sense amplifier (SA) as illustrated in FIG. 2 is composed of a flip-flop circuit constituted by two n-channel type MISFETs ($Qn_1$ and $Qn_2$) and two p-channel type MISFETs ($Qp_3$ and $Qp_4$), thereby amplifying and outputting minute signals that are read from the memory cell (MC) selected in the memory array to the bit-line pair (BLT and BLB).

The SRAM and the ROM are each composed of a memory array and a peripheral circuit. Each memory cell of the SRAM is composed of an n-channel type MISFET and a p-channel type MISFET, and the peripheral circuit is composed of an n-channel type MISFET and a p-channel type MISFET. Further, each memory cell of the ROM is composed of an n-channel type MISFET while the peripheral circuit is composed of an n-channel type MISFET and a p-channel type MISFET.

Figure 3:
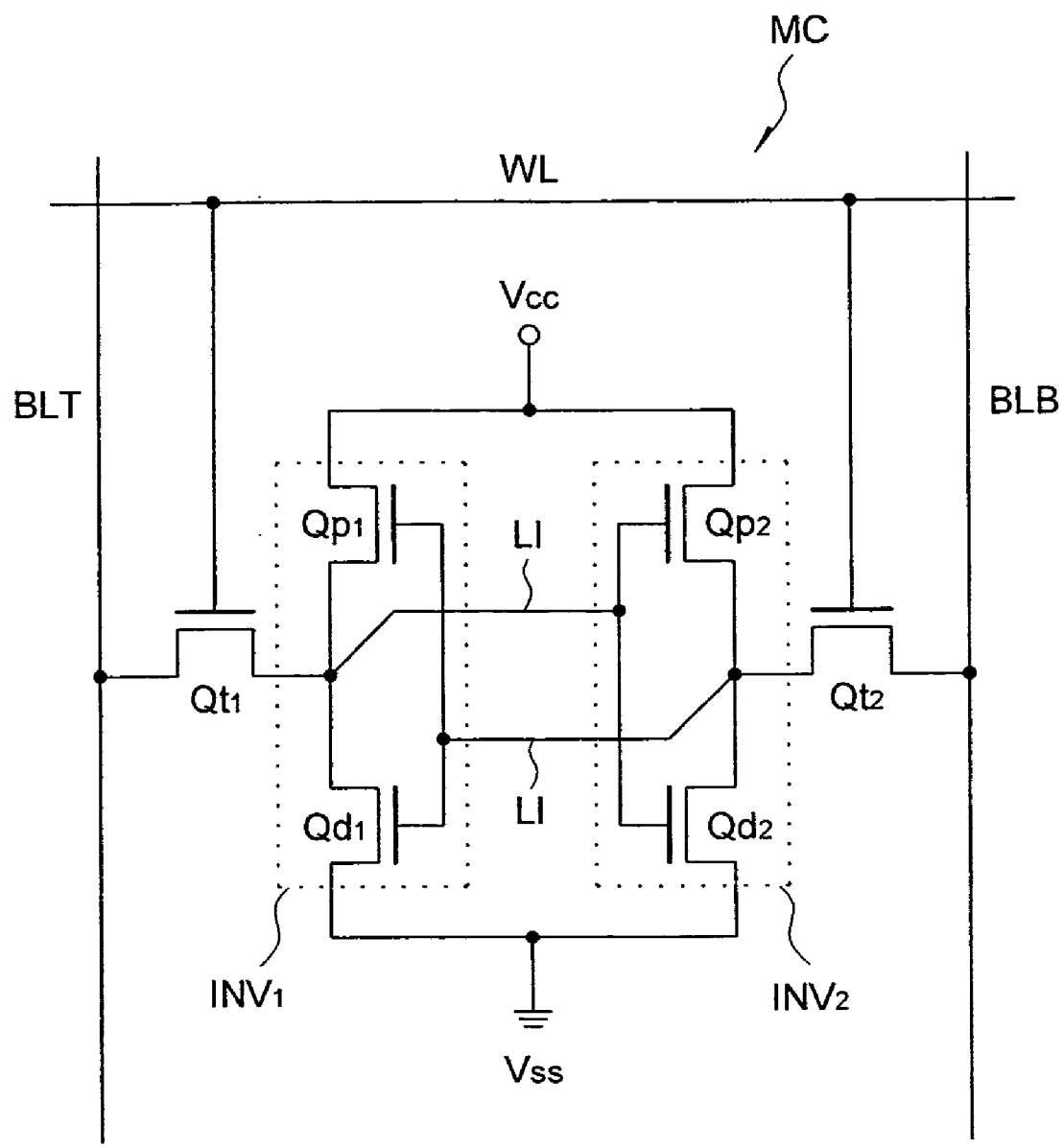
FIG. 3 is an equivalent circuit view of a memory cell of a SRAM, which is a portion of the logic device with memory as illustrated in FIG. 1.

As illustrated in FIG. 3, the memory cell (MC) in the SRAM is composed of a pair of MISFETs ($Qd_1$ and $Qd_2$) for driver, a pair of MISFETs ($Qp_1$ and $Qp_2$) for load, and a pair of MISFETs ($Qt_1$ and $Qt_2$) for transfer, all of which is disposed at the intersection between the bit-line pair (BLT and BLB) and the word line (WL). The MISFETs for driver ($Qd_1$ and $Qd_2$) and the MISFETs for transfer ($Qt_1$ and $Qt_2$) are composed of n-channel type MISFETs while the MISFETs for load ($Qp_1$ and $Qp_2$) are composed of a p-channel type MISFET.

From among the above six MISFETs constituting the memory cell (MC) in the SRAM, the MISFET for driver ($Qd_1$) and the MISFET for load ($Qp_1$) constitute a first inverter ($INV_1$), and the MISFET for driver ($Qd_2$) and the MISFET for load ($Qp_2$) constitute a second inverter ($INV_2$). The pair of inverters ($INV_1$ and $INV_2$) is cross-linked in the memory cell (MC) through a pair of local wirings (LI and LI), whereby a flip-flop circuit is composed as an information accumulating portion for storing some pieces of information corresponding to 1 bit.

From among the n-channel type MISFET and the p-channel type MISFET constituting the above-described logic device with memory, the gate electrode of the n-channel type MISFET has a polycide structure in which a tungsten silicide film is laminated on an upper portion of an n-type poly-silicon film. Meanwhile, the gate electrode of the p-channel type MISFET has a polycide structure in which a tungsten silicide film is laminated on an upper portion of a p-type poly-silicon film. That is, the logic device with memory has a polycide's dual-gate structure.

Next, a method of manufacturing the above-mentioned logic device with memory will be explained with reference to FIGS. 4 to 19.

Figure 4:
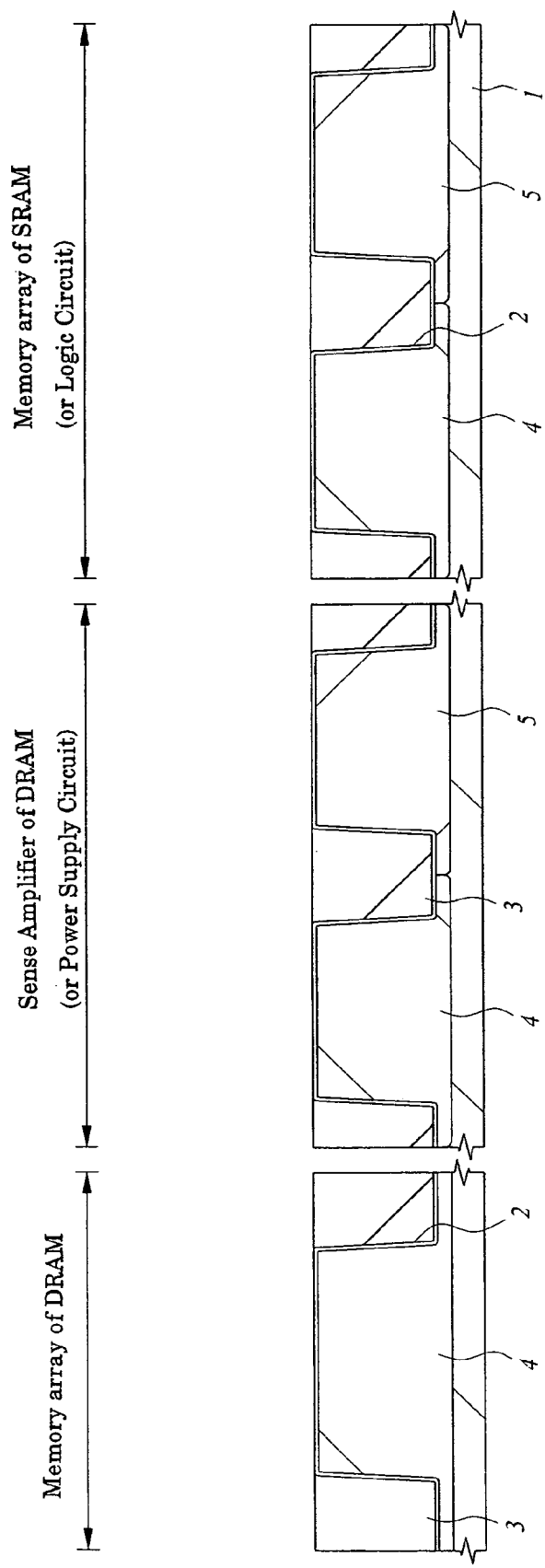
FIG. 4 is a sectional view showing a principal portion of a semiconductor substrate in a method of manufacturing a logic device with memory according to one embodiment of the present invention.

As illustrated in FIG. 4, in accordance with normal manufacturing methods, grooves are formed on a main surface of a substrate 1 made of p-type monocrystal silicon, and then an oxide silicon film 3 is buried in the interior thereof to form isolation grooves 2. Next, phosphor (P) is ion-implanted into one portion of the main surface of the substrate 1 and B (boron) is ion-implanted into the other portion. Thereafter, the substrate 1 is thermally treated to diffuse their impurities (B and P), whereby p-type wells 4 and n-type wells 5 are formed.

A left-hand side portion in FIG. 4 is a sectional view illustrating a portion of the memory array of the DRAM, a central portion is a sectional view illustrating a portion of the memory array associate circuit (for example, a sense amplifier) adjacent to the memory array, and a right-hand side portion is a sectional view illustrating a portion of the memory array of the SRAM (hereinafter, the other drawings is also similar thereto).

Figure 5:
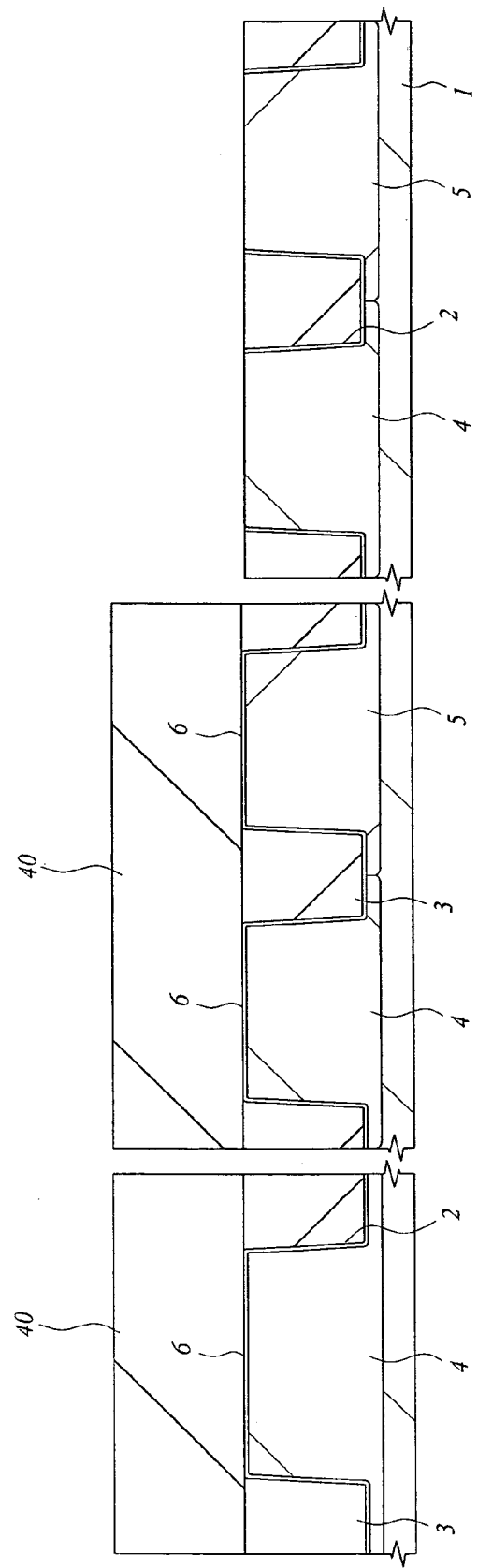
FIG. 5 is a sectional view showing a principal portion of a semiconductor substrate in a method of manufacturing a logic device with memory according to one embodiment of the present invention.

Next, impurities for controlling threshold voltage of the MISFET are ion-implanted into the respective surfaces of the p-type well 4 and the n-type well 5. Thereafter, the substrate 1 is thermally oxidized to form a gate oxide film 6 having a thickness of approximately 3 to 4 nm on the surface thereof, as illustrated in FIG. 5. Subsequently, the gate oxide films 6 of a memory array region and a sense amplifier region of the DRAM are covered with a photoresist film 40, and the gate oxide film 6 of a memory array region in the SRAM is removed by using hydrofluoric acid.

Figure 6:
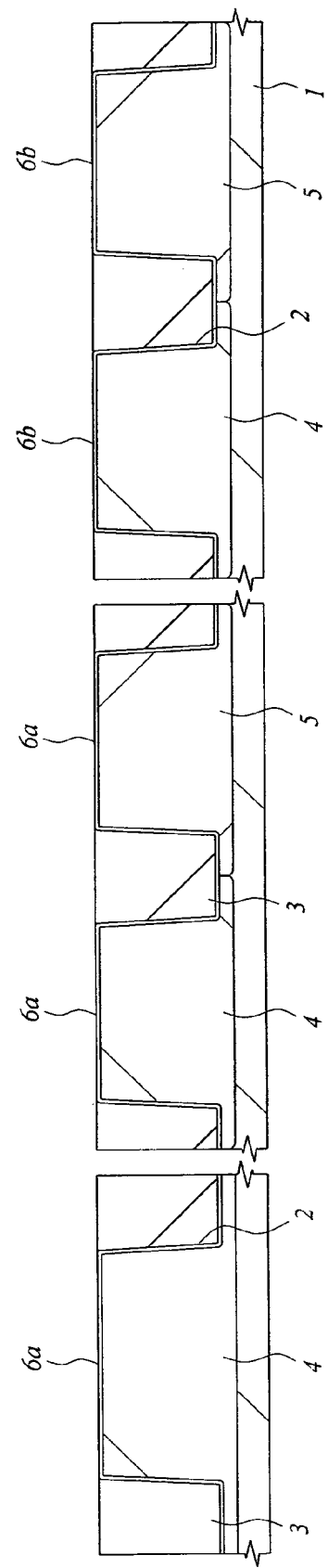
FIG. 6 is a sectional view showing a principal portion of a semiconductor substrate in a method of manufacturing a logic device with memory according to one embodiment of the present invention.

Next, after removing the photoresist film 40, the substrate 1 is thermally oxidized once again, as illustrated in FIG. 6, whereby a thin gate oxide film 6b having a thickness of approximately 3 nm is formed on the memory array region of the SRAM. Also, By performing this thermal oxidation, since the gate oxide films 6 of the memory array region and the sense amplifier region in the DRAM re-grow, a thick gate oxide film 6a having a thickness of approximately 6 to 7 nm is formed in these regions.

Thus, in the DRAM from the viewpoint of securing some signal amount for the memory cell, since relatively high voltage needs to be applied to the gate electrode of the selecting MISFET, the thick gate oxide film 6a is formed in the memory array region, whereby withstand pressure is secured therein.

Further, the memory array associate circuit such as the sense amplifier and the sub word driver needs to array elements with a high density. Therefore, when the gate electrode of n-channel type MISFET and the gate electrode of p-channel type MISFET are connected, it is desirable to directly connect the gate electrodes without separating them from each other from the viewpoint of reducing a wiring density. However, in this case, if a n-type poly-silicon film is used for the gate electrode of n-channel type MISFET and the a p-type poly-silicon film is used for the gate electrode of p-channel type MISFET, the mutual diffusion of the impurities occurs at a portion where the n-type poly-silicon film and the p-type poly-silicon film are in direct contact with each other, whereby the threshold voltage or contact resistance of the MISFET is varied.

Thus, in the present embodiment, the memory array associate circuit of the DRAM, such as the sense amplifier or sub word driver, in which the elements are disposed with the high density uses a n-type poly-silicon film as each of the gate electrode of n-channel type MISFET and the gate electrode of p-channel type MISFET, thereby avoiding adverse effects owing to the mutual diffusion of the impurities. Meanwhile, in this case, since the p-channel type MISFET become of a buried channel type, the short channel effects become apparent. Therefore, the thick gate oxide film 6a is formed in a region of the memory array associate circuit, whereby the short channel effects are suppressed.

Further, in the present embodiment, the thick gate oxide film 6a is formed in a circuit region where a gate dielectric film with high withstand pressure is required similarly to the power supply circuit or input/output circuit. Meanwhile, in the memory array of the SRAM or logic circuit that need to give priority to miniaturization and high performance of the elements, the thin gate oxide film 6b is formed and the dual-gate structure is adopted.

Figure 7:
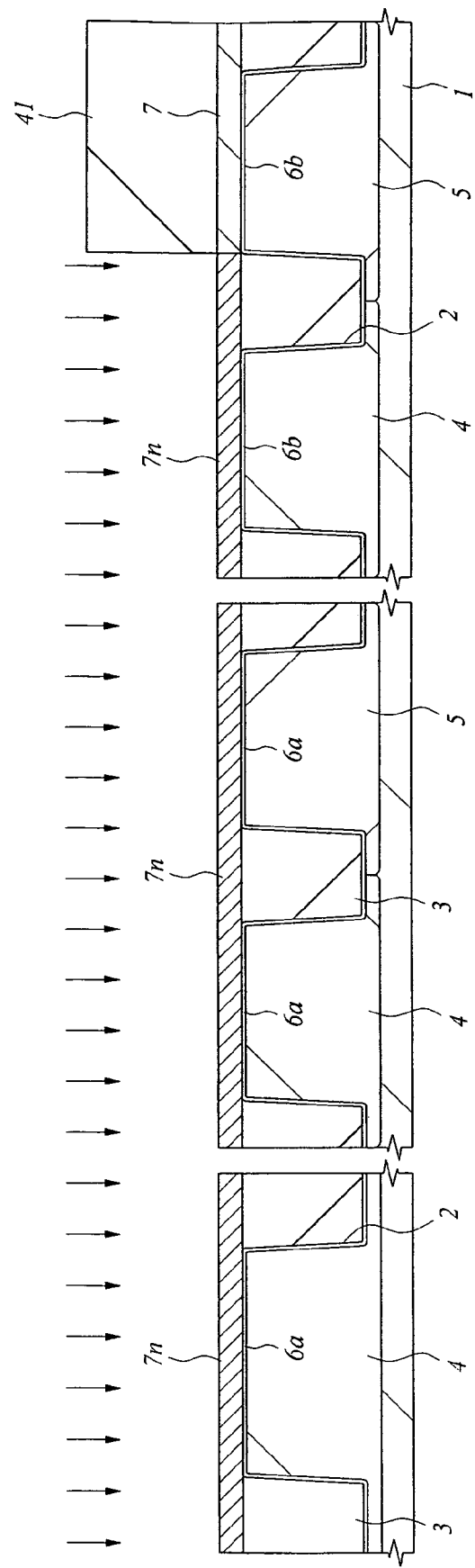
FIG. 7 is a sectional view showing a principal portion of a semiconductor substrate in a method of manufacturing a logic device with memory according to one embodiment of the present invention.

Next, as illustrated in FIG. 7, after depositing a poly-silicon film 7 onto the substrate 1 by a CVD method, the poly-silicon film 7 in a p-channel type MISFET forming region (n-type well 5) in the memory array region of the SRAM is covered with a photoresist film 41, and P (phosphor) is ion-implanted into the poly-silicon film 7 in an n-channel type MISFET forming region (p-type wells 4) of the SRAM, a memory array region of the DRAM, and a memory array associate circuit forming region, whereby an n-type poly-silicon film 7n is formed. Note that an amorphous silicon film may is used instead of the above-mentioned poly-silicon film 7.

Figure 8:
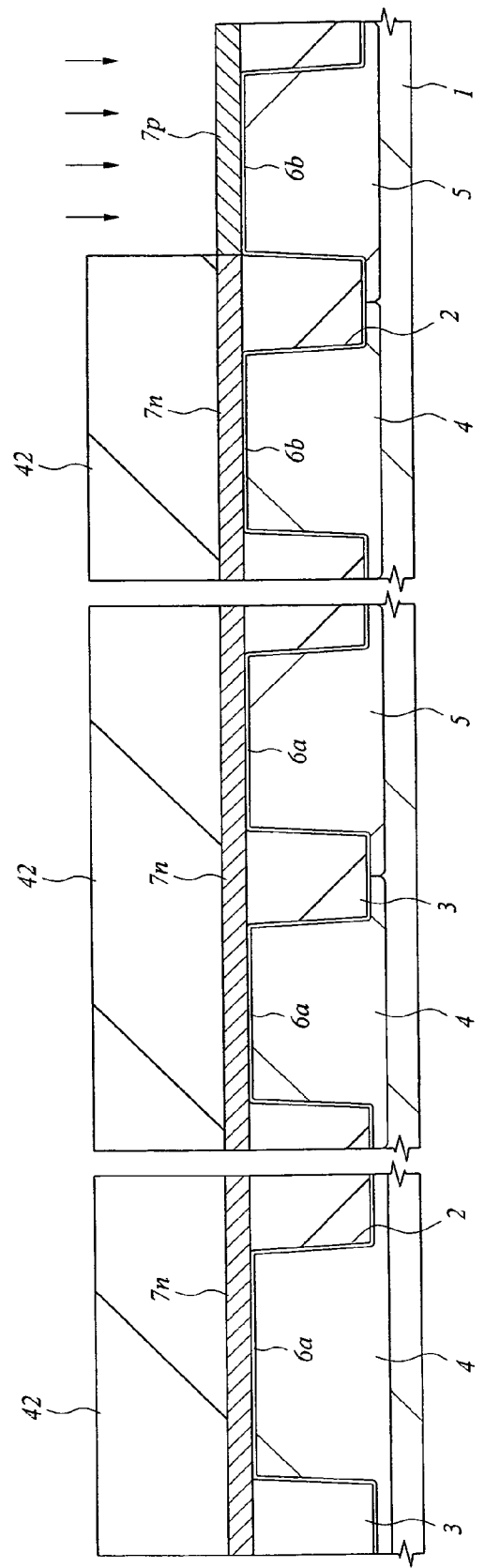
FIG. 8 is a sectional view showing a principal portion of a semiconductor substrate in a method of manufacturing a logic device with memory according to one embodiment of the present invention.

Next, after removing the photoresist film 41, as illustrated in FIG. 8, the n-channel type MISFET forming region (p-type well 4) in the memory array region in the SRAM, the memory array region of the DRAM, and the memory array associate circuit region are covered with a photoresist film 42, and B (boron) is ion-implanted into the poly-silicon film 7 in the p-channel type MISFET forming region (n-type wells 5) in the memory array region in the SRAM, whereby a p-type poly-silicon film 7p is formed.

Figure 9:
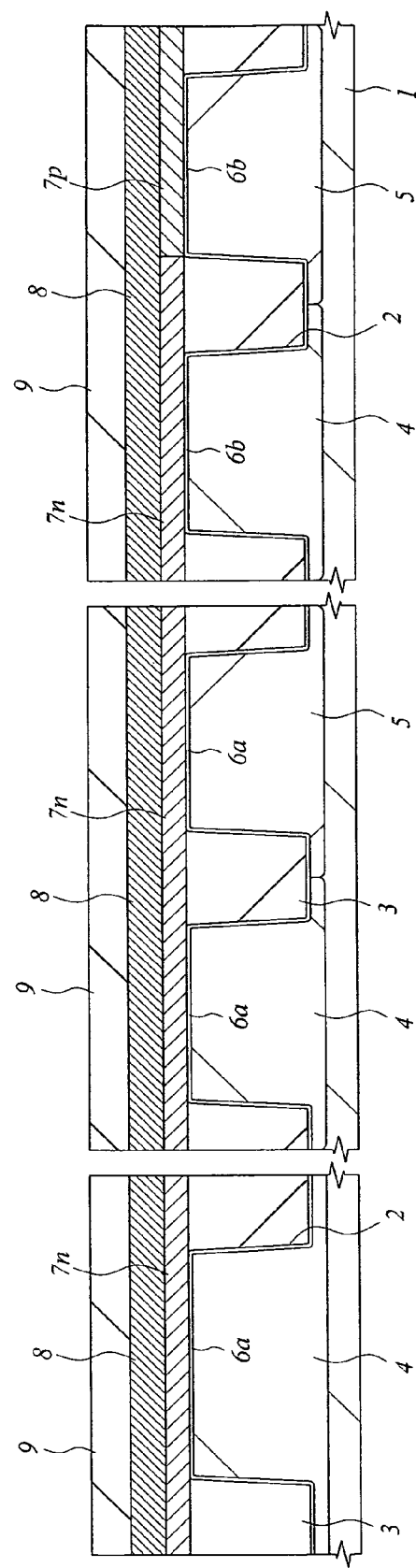
FIG. 9 is a sectional view showing a principal portion of a semiconductor substrate in a method of manufacturing a logic device with memory according to one embodiment of the present invention.

Next, after removing the photoresist film 42, as illustrated in FIG. 9, a W (tungsten) silicide film 8 is deposited by a spattering method on respective upper portions of the n-type poly-silicon film 7n and the p-type poly-silicon film 7p, and a silicon nitride film 9 is further formed thereon by the CVD method.

The conductive film on each upper portion of the poly-silicon films (7n and 7p) may be made of W (tungsten) instead of W silicide. In this case, to prevent occurrence of contact reactions between the poly-silicon films (7n and 7p) and the W film, a barrier layer such as WN (tungsten nitride) may be provided between both films. Also, the dielectric film on an upper portion of the W silicide film 8 may be composed of a laminated film of a silicon oxide film and a silicon nitride film instead of the silicon nitride film 9.

In this manner, the logic device with memory according to the present embodiment adopts a policide structure in which W silicide is laminated onto poly-silicon as a material for forming a low resistance gate electrode that can cope with a high-temperature heat treatment during a manufacturing process, for example, the high-temperature heat treatment in forming a capacitor of the memory cell of the DRAM as described later.

Figure 10:
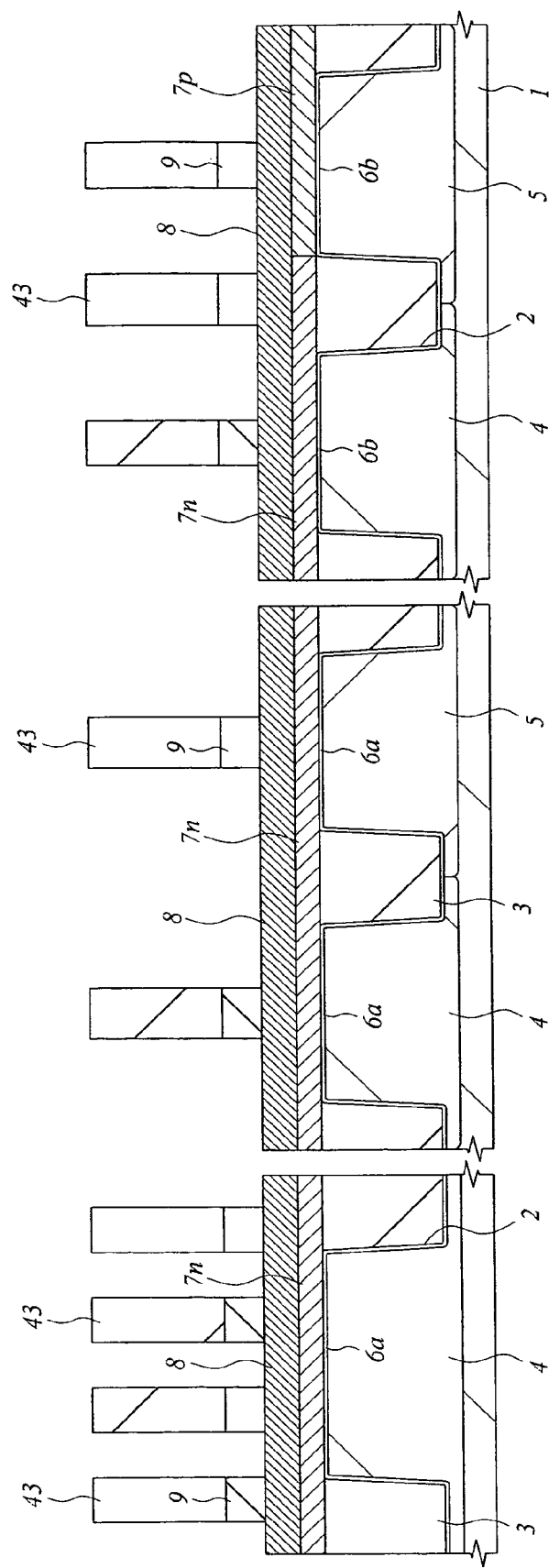
FIG. 10 is a sectional view showing a principal portion of a semiconductor substrate in a method of manufacturing a logic device with memory according to one embodiment of the present invention.

Next, as illustrated in FIG. 10, a photoresist film 43 is formed on the silicon nitride film 9, and the silicon nitride film 9 is patterned to have the same planar shape as that of the gate electrode by dry etching using the photoresist film 43 as a mask.

Figure 11:
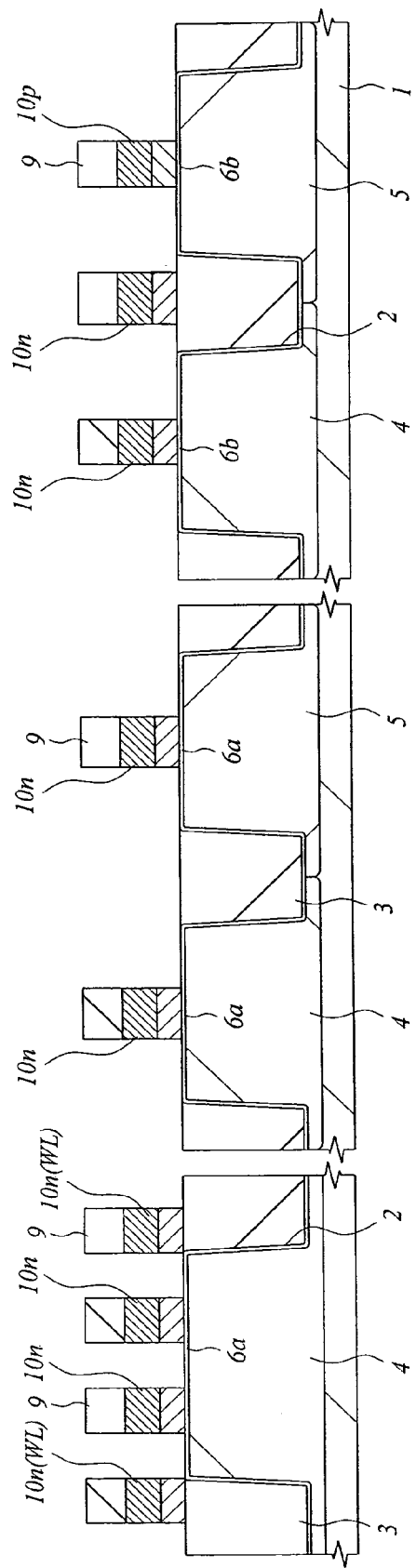
FIG. 11 is a sectional view showing a principal portion of a semiconductor substrate in a method of manufacturing a logic device with memory according to one embodiment of the present invention.

After removing the photoresist film 43, as illustrated in FIG. 11, the W silicide film 8, the n-type poly-silicon film 7n, and the p-type poly-silicon film 7p are patterned by the dry etching using the silicon nitride film 9 as a mask. By doing so, gate electrodes 10n (word lines WL) of the selecting MISFET (Qs) are formed in the memory array region of the DRAM, and respective gate electrodes 10n and 10n of the n-channel type MISFET and the p-channel type MISFET which constitute the sense amplifier (SA) are formed in the memory array associate region. Also, respective gate electrodes 10n and 10n of the MISFET for driver (Qd) and the MISFET for transfer (Qt), and gate electrode 10p of the MISFET for load (Qp) are formed in the memory array region of the SRAM. Note that only the respective gate electrodes 10n and 10n of the pair of MISFETs for driver (Qd$_1$ and Qd$_2$) and one gate electrode 10p of the pair of MISFET for load (Qp$_1$ and Qp$_2$) are illustrated in this Figure.

Figure 12:
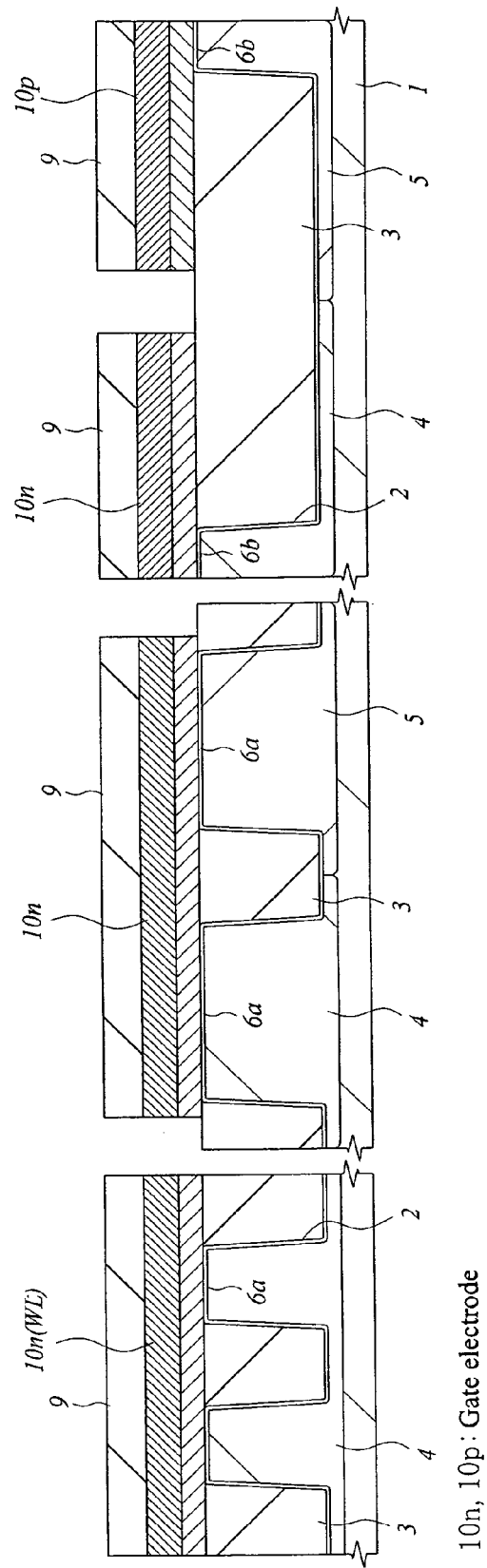
FIG. 12 is a sectional view showing a principal portion of a semiconductor substrate in a method of manufacturing a logic device with memory according to one embodiment of the present invention.

FIG. 12 is a sectional view along an extending direction of the gate electrodes 10n and 10p formed respectively in the memory array region of the DRAM, the memory array associate circuit region, and the memory array region of the SRAM.

As illustrated in this Figure, in the sense amplifier (SA) of the DRAM, when the gate electrode 10n of the n-channel type MISFET and the gate electrode 10n of the p-channel type MISFET are to be connected, both electrodes are directly connected without interposing any metallic wirings (central portion in the Figure). In this case, since both conductivity types of the gate electrode 10n of the n-channel type MISFET and the gate electrode 10p of the p-channel type MISFET are of n types, the mutual diffusion of the impurities is out of the question.

Meanwhile, in the case of the memory cell of the SRAM, the conductivity types of the gate electrode 10n of the MISFET for driver (Qd) and the gate electrode 10p of MISFET for load (Qp) are different from each other. Therefore, both are separated (right-hand side in the Figure) to prevent the mutual diffusion of impurities, and both electrodes are electrically connected via a metallic wiring formed in the following steps.

When the dry etching is performed to form the above-described gate electrodes 10n and 10p, lower portions of respective sidewalls of the gate electrodes 10n and 10p the gate oxide films 6a and 6b in the peripheral region are also cut off to some extent and the thickness of the films is reduced, whereby there arises the problem such as degradation in gate withstanding pressure if such a situation remains unchanged.

Therefore, by performing a heat treatment (re-oxidation process) of the substrate 1 after the above-described dry etching, the thinned gate dielectric films 6a and 6b are thickened. Such a re-oxidation process is performed by performing the heat treatment of the substrate 1 in a reduction atmosphere of, for example, 800° C. containing a mixed gas of 90% hydrogen and 10% vapor.

Since the above-described heat treatment at high temperature is performed in a step after the gate electrodes 10n and 10p of mutually different conductivity types have been separated, no mutual diffusion of impurities is generated. In this manner, no heat treatment at high temperature (for example, 700° C. or more) is performed in the steps before the gate electrodes 10n and 10p of mutually different conductivity types are separated, and the heat treatment at high temperature is performed in the step after the gate electrodes 10n and 10p of mutually different conductivity types have been separated. Therefore, it is possible to certainly prevent the mutual diffusion of impurities that can be caused among the gate electrodes 10n and 10p of mutually different conductivity types.

Figure 13:
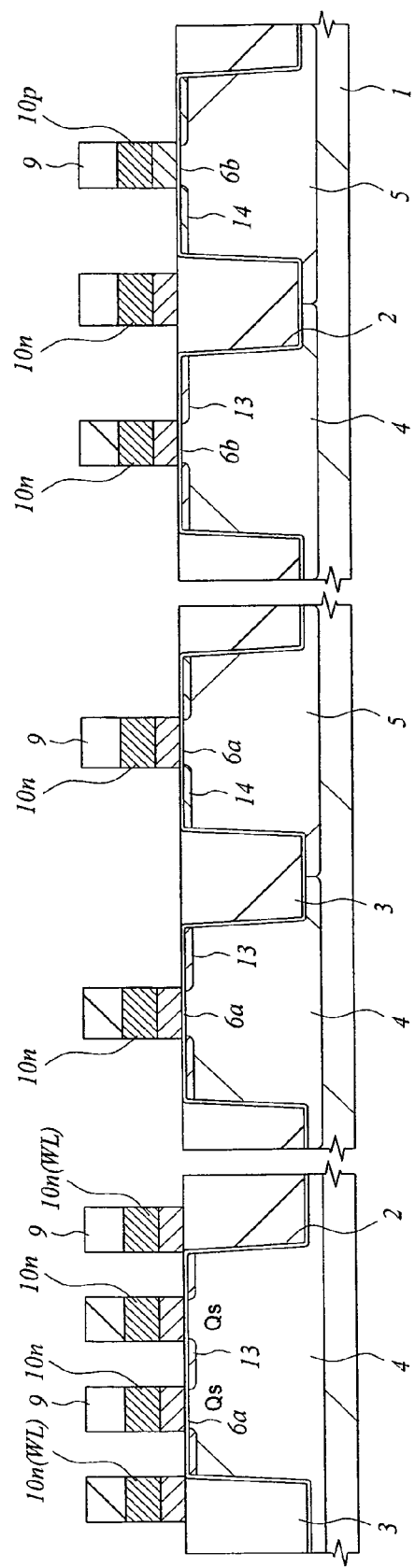
FIG. 13 is a sectional view showing a principal portion of a semiconductor substrate in a method of manufacturing a logic device with memory according to one embodiment of the present invention.

Next, as illustrated in FIG. 13, As (arsenic) is ion-implanted into the p-type wells 4 to form n$^-$-type semiconductor regions 13, and B (boron) is ion-implanted into the n-type wells 5 to form p$^-$-type semiconductor regions 14. The n$^-$-type semiconductor region 13 formed in the memory array of the DRAM constitutes source and drain regions of the selecting MISFET (Qs). In other words, the selecting MISFETs (Qs) are formed in the memory array region of the DRAM through the steps performed so far.

Meanwhile, the n$^-$-type semiconductor region 13 and the p$^-$-type semiconductor region 14 formed in the memory array associate circuit region of the DRAM are low-density semiconductor regions for making the n-channel type MISFET and the p-channel type MISFET be of a LDD (Lightly Doped Drain) structure.

The n-type semiconductor region 13 of the n-channel type MISFET and the p-type semiconductor region 14 of the p-channel MISFET that are formed in the memory array region of the SRAM are high-density semiconductor regions in which extremely shallow junction is made for suppressing the short channel effects and for securing drain currents.

Figure 14:
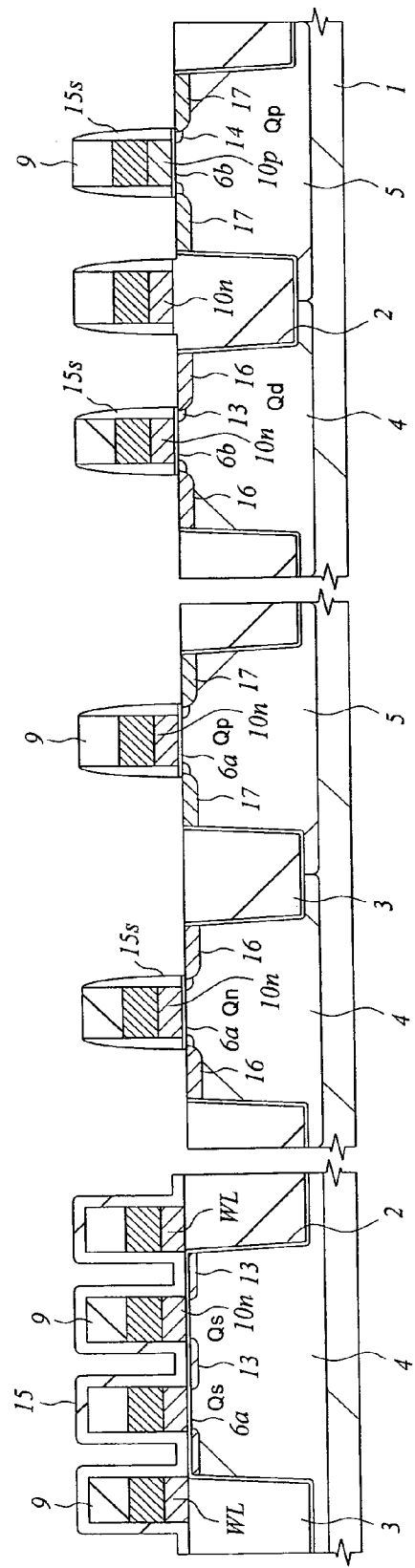
FIG. 14 is a sectional view showing a principal portion of a semiconductor substrate in a method of manufacturing a logic device with memory according to one embodiment of the present invention.

Next, as illustrated in FIG. 14, after depositing a silicon nitride film 15 over the substrate 1 through the CVD method, the silicon nitride film 15 in the memory array associate circuit region of the DRAM and in the memory array region of the SRAM is anisotropically etched, whereby side wall spacers 15s are formed on sidewalls of the gate electrodes 10n and 10p in these regions. Next, As (arsenic) or P (phosphor) is ion-implanted into the p-type wells 4 of the memory array associate circuit region in the DRAM and of the memory array region in the SRAM, and B (boron) is ion-implanted into the n-type wells 5 of these regions. Further, the substrate 1 is thermally treated at a temperature of approximately 900 to 1000° C. to diffuse the above-mentioned impurities, whereby a n$^+$-type semiconductor regions (source and drain) 16 of the n-channel type MISFET are formed in the p-type wells 4 in the above-mentioned regions and a p$^+$-type semiconductor region (source and drain) 17 of the p-channel type MISFET is formed in the n-type well 5. The above-described high-temperature heat treatment is performed in a step after the gate electrodes 10n and 10p of mutually different conductivity types have been separated, so that no mutual diffusion of impurities is caused.

By the steps performed so far, the n-channel type MISFET (Qn) and the p-channel type MISFET (Qp) constituting the sense amplifier (SA) are formed in the memory array associate circuit region of the DRAM, and the n-channel type MISFET for driver (Qd), a MISFET for transfer (Qt) (not shown), and the p-channel type MISFET for load (Qp) are formed in the memory array region of the SRAM.

Figure 15:
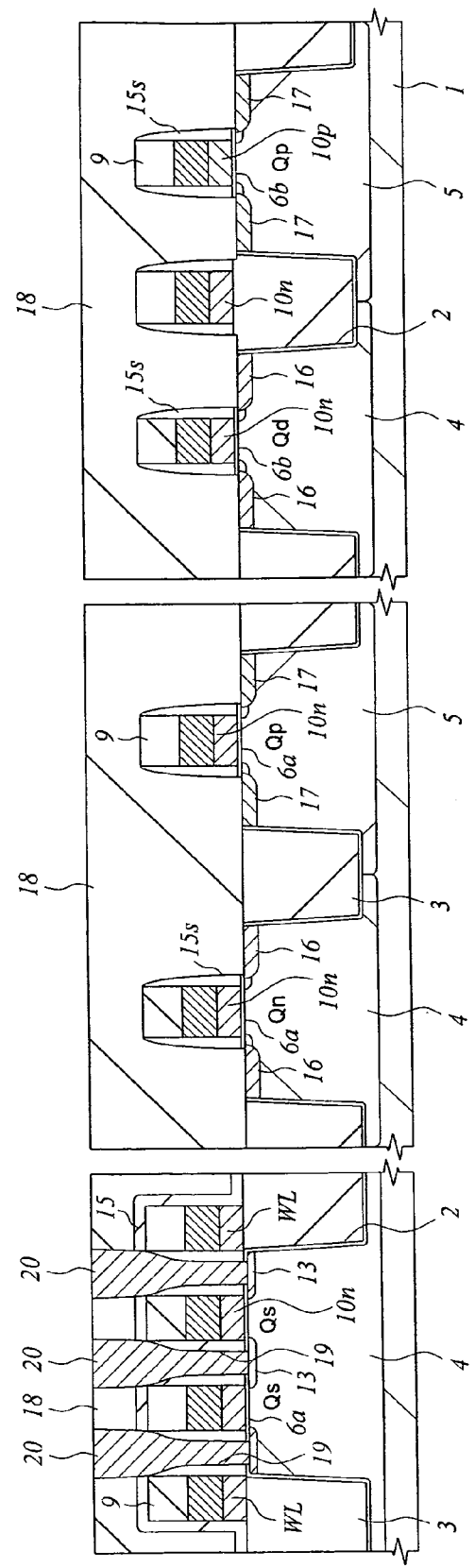
FIG. 15 is a sectional view showing a principal portion of a semiconductor substrate in a method of manufacturing a logic device with memory according to one embodiment of the present invention.

Next, as illustrated in FIG. 15, a silicon oxide film 18 is deposited over the substrate 1 through the CVD method and then contact holes 19 are formed on an upper portion of the source or drain (n$^-$-type semiconductor region 13) disposed in the memory array region of the DRAM. Thereafter, plugs 20 each formed of an n-type poly-silicon film are buried inside the contact holes 19.

Figure 16:
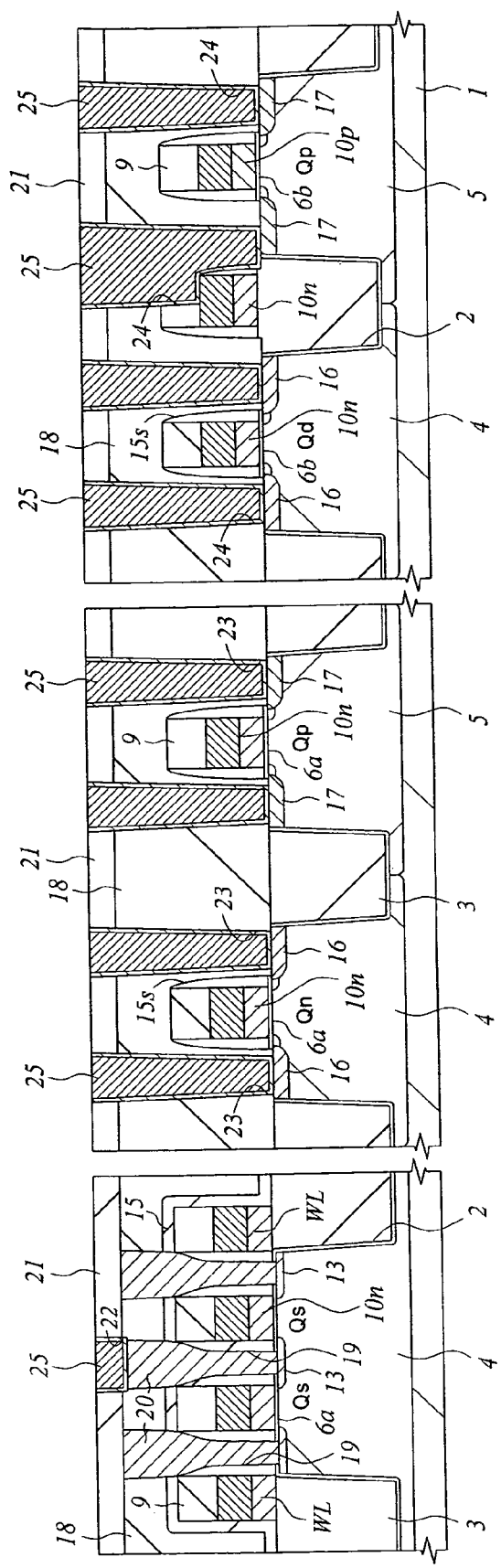
FIG. 16 is a sectional view showing a principal portion of a semiconductor substrate in a method of manufacturing a logic device with memory according to one embodiment of the present invention.
Figure 17:
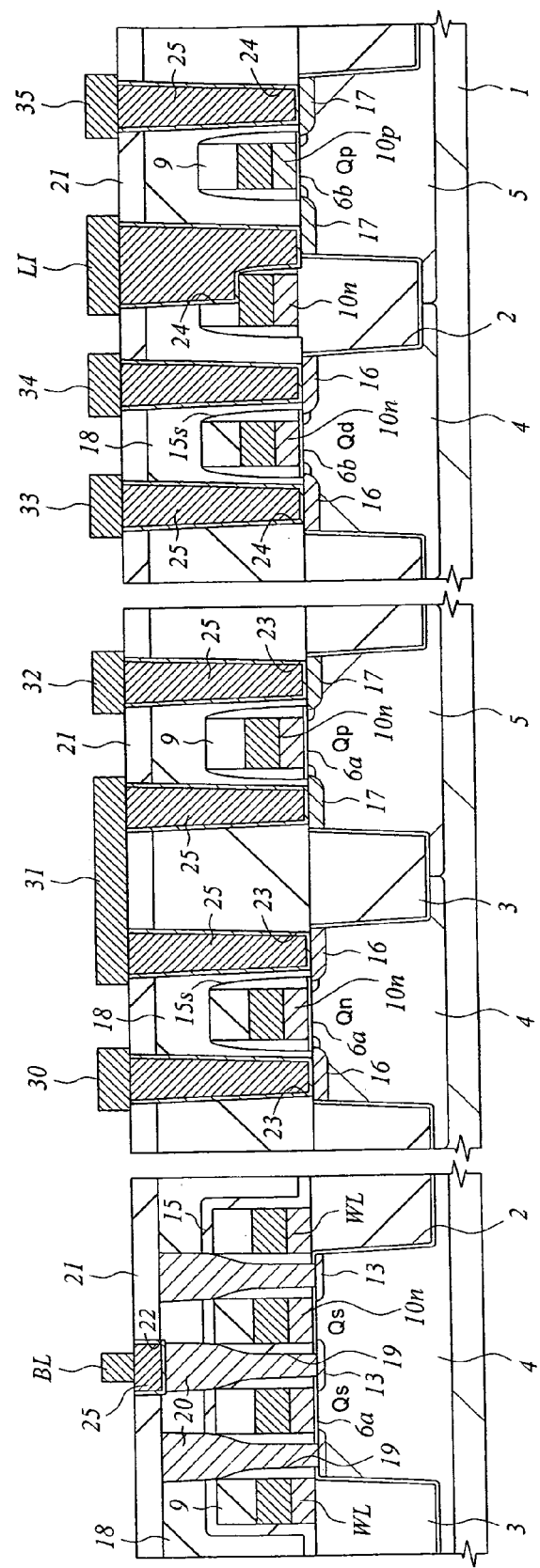
FIG. 17 is a sectional view showing a principal portion of a semiconductor substrate in a method of manufacturing a logic device with memory according to one embodiment of the present invention.
Figure 18:
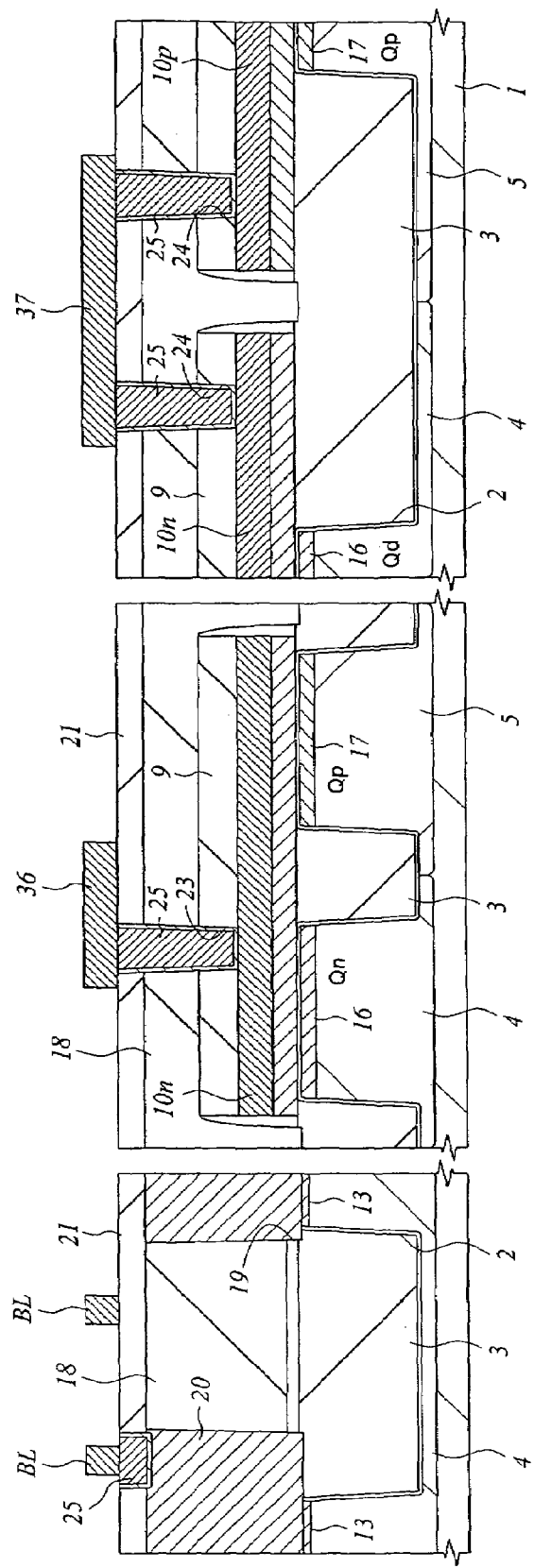
FIG. 18 is a sectional view showing a principal portion of a semiconductor substrate in a method of manufacturing a logic device with memory according to one embodiment of the present invention.

Then, as illustrated in FIG. 16, after depositing a silicon oxide film 21 on the silicon oxide film 18 through the CVD method, a through hole 22 is formed on the plugs 20 formed in the memory array region of the DRAM, and contact holes 23 are formed on the source and drain (n$^+$-type semiconductor region 16 and p$^+$-type semiconductor region 17) formed in the memory array associate circuit region, and contact holes 24 are formed on the source and drain (n$^+$-type semiconductor region 16 and p$^+$-type semiconductor region 17) formed in the memory array region of the SRAM and above the gate electrodes 10n. Then, plugs 25 formed of, for example, a laminated film of a titanium nitride film (TiN) and a W film are buried into respective interiors of the through holes 22 and the contact holes 23 and 24. Next, as illustrated in FIGS. 17 and 18 (sectional view along an extending direction of the gate electrodes 10n and 11p), by patterning the W film deposited on the silicon oxide film 21 through the spattering method, a bit line BL is formed in the memory array region of the DRAM, wirings 30 to 32 and 36 are formed in the memory array associate circuit region and wirings 33 to 35 and 37 as well as a local wiring LI are formed in the memory array region of the SRAM. As illustrated in FIG. 18, since the gate electrodes 10n and 11p in the memory array region of the SRAM are separated from each other, the electrodes are connected through the wiring 37 at a portion needing to connect these electrodes.

Figure 19:
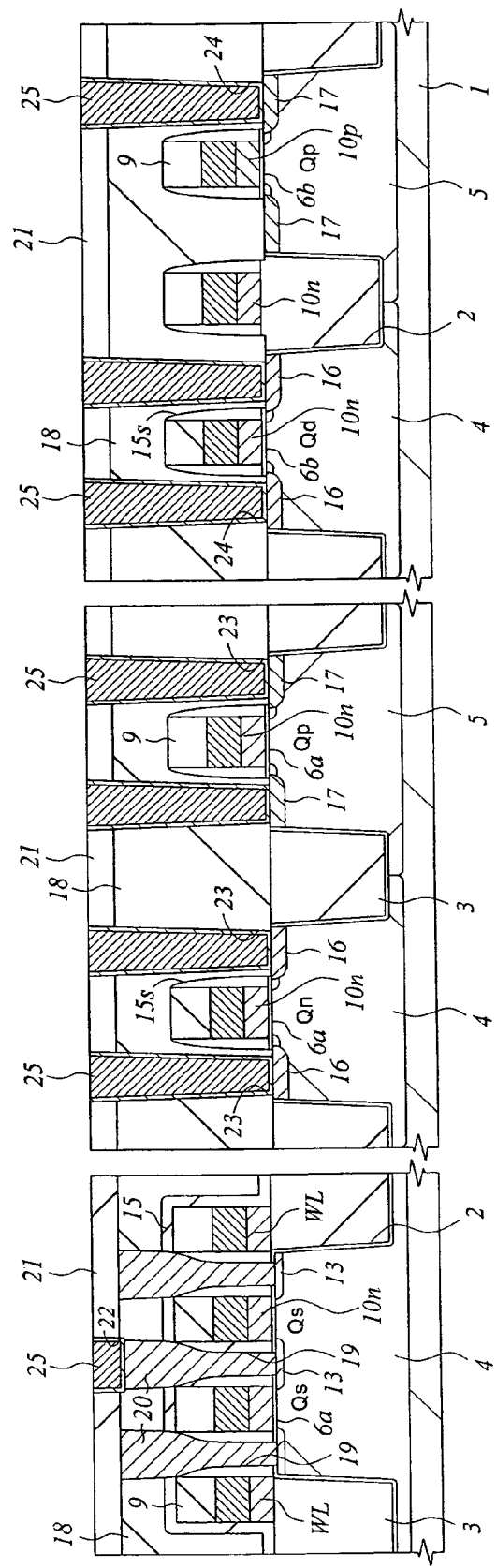
FIG. 19 is a sectional view showing a principal portion of a semiconductor substrate in a method of manufacturing a logic device with memory according to one embodiment of the present invention.
Figure 20:
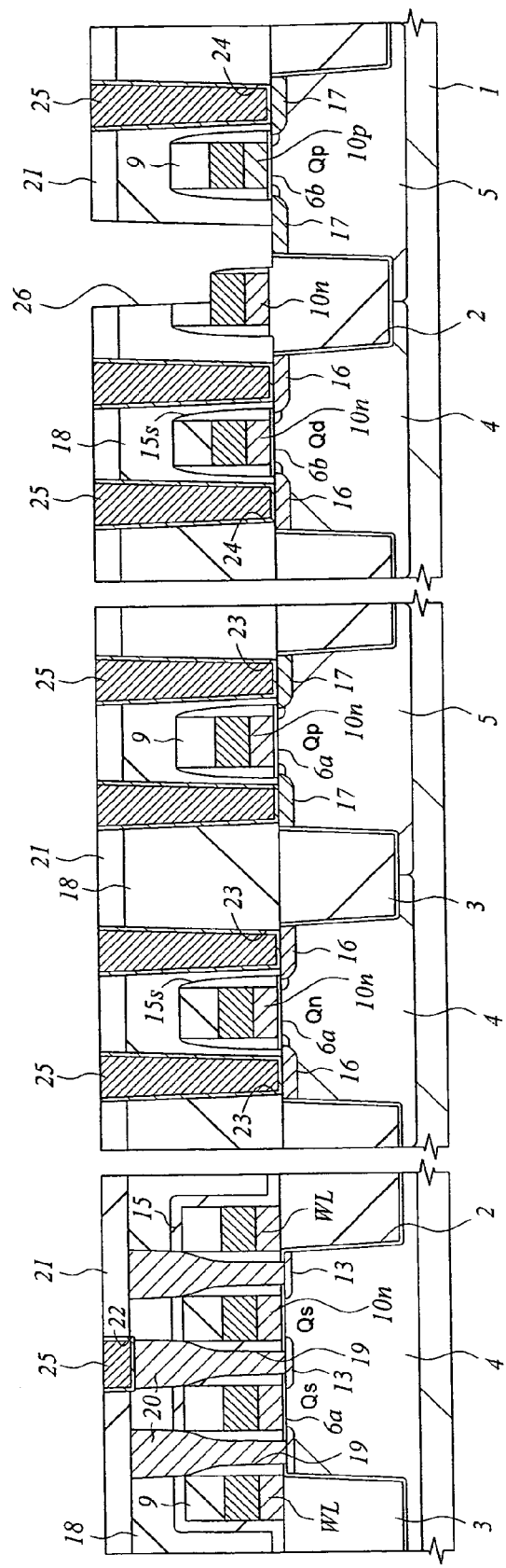
FIG. 20 is a sectional view showing a principal portion of a semiconductor substrate in a method of manufacturing a logic device with memory according to one embodiment of the present invention.
Figure 21:
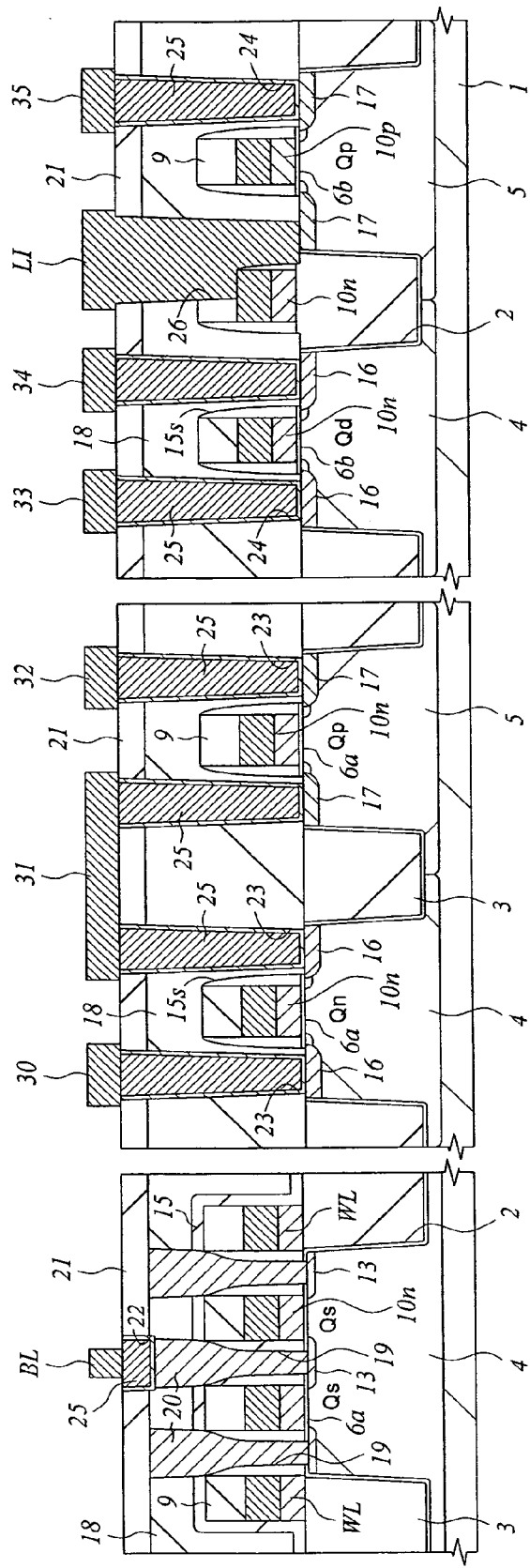
FIG. 21 is a sectional view showing a principal portion of a semiconductor substrate in a method of manufacturing a logic device with memory according to one embodiment of the present invention.

Note that, the plugs 25 have been buried into the contact holes 24, which are disposed above the source and drain ($n^+$-type semiconductor region 16 and $p^+$-type semiconductor region 17) in the memory array region of the SRAM and on the gate electrode 10n in the above-mentioned example. However, for example, the following configuration may be also adopted: as shown in FIG. 19, the contact holes 24 and the plugs 25 are not formed on the source and drain ($n^+$-type semiconductor region 16 and $p^+$-type semiconductor region 17) and on the gate electrodes 10n in the step as illustrated in FIG. 16; as shown in FIG. 20, a contact hole 26 is formed above the source and drain ($n^+$-type semiconductor region 16 and $p^+$-type semiconductor region 17) and the gate electrode 10n after the step as illustrated in FIG. 16; and then, as shown in FIG. 21, the local wiring LI formed in the steps as illustrated in FIGS. 17 and 18 is directly connected to the source and drain ($n^+$-type semiconductor region 16 and $p^+$-type semiconductor region 17) and the gate electrode 10n.

Figure 22:
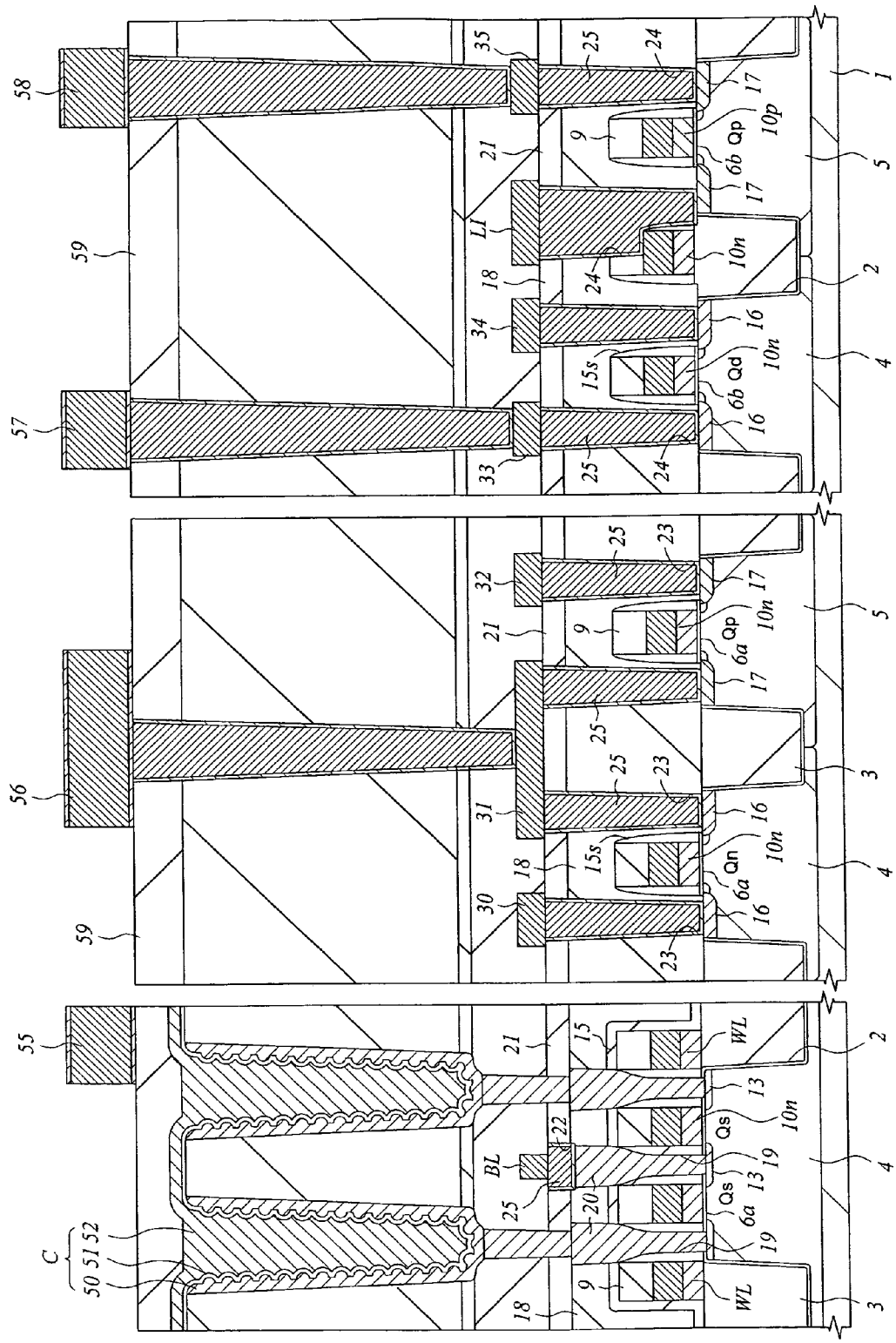
FIG. 22 is a sectional view showing a principal portion of a semiconductor substrate in a method of manufacturing a logic device with memory according to one embodiment of the present invention.

Thereafter, as illustrated in FIG. 22, capacitors C, each of which comprises a lower electrode 50, a capacitive dielectric film 51, and an upper electrode 52, are formed in the memory array region of the DRAM, and then wirings 55 to 58 to be a second layer are formed on an upper layer of the capacitors C. A lower electrode 50 of each capacitor C is composed of a n-type poly-silicon film deposited by, for example, the CVD method, and an upper electrode 52 thereof is composed of a titanium nitride film deposited by the spattering and CVD methods. The capacitive dielectric film 51 is formed by: depositing a tantalum oxide film on the lower electrode 50 through the CVD method; and then performing a heat treatment of the tantalum oxide film at approximately 700 to 800° C. The wirings 55 to 58 to be the second layer are formed by patterning an aluminum (Al) alloy film deposited onto the silicon oxide film 59 covering the capacitors C through the spattering method.

In the foregoing, the invention made by the present inventors has been concretely described based on the embodiment. However, needless to say, the present invention is not limited to the above-mentioned embodiment and can be variously modified and altered without departing from the gist thereof.

In the above-mentioned embodiment, the case where the gate electrode of n-channel type MISFET and the gate electrode of p-channel type MISFET that constitute the memory array associate circuit of the DRAM are of the same conductivity type has been described. However, if it is desired that the short channel effects of these MISFETs are effectively suppressed, a thin gate oxide film and a dual-gate structure may be adopted similarly to the memory array of the SRAM or the logic circuit of the MISFET.

In the above-mentioned embodiment, the present invention is applied to the case where the manufacturing process of the logic device with memory has been described. However, the present invention is not limited to this and can be widely applied to the manufacturing process of the device adopting a polycide's dual-gate structure.

Effects obtained from representative ones of the inventions disclosed by this application will be briefly described as follows.

In the device adopting the polycide's dual-gate structure, it is possible to certainly suppress the mutual diffusion of the impurities in the gate electrodes disposed near the boundary between the n-channel type MISFET and the p-channel type MISFET.

What is claimed is:

1. A method of manufacturing a semiconductor integrated circuit device, which forms an n-channel type MISFET and a p-channel type MISFET over a semiconductor substrate, the method comprising the steps of:
   (a) forming a gate dielectric film over a main surface of said semiconductor substrate, and thereafter forming a silicon film over said gate dielectric film;
   (b) introducing a plurality of kinds of impurities into said silicon film, and thereby defining one portion of said silicon film as a n-type silicon film and the other portion as a p-type silicon film;
   (c) forming, above each of said n-type silicon film and said p-type silicon film, a conductive film containing tungsten or tungsten silicide as a main component;
   (d) patterning said conductive film, said n-type silicon film, and said p-type silicon film after said step (c), and thereby forming a gate electrode of n-channel type MISFET, which is composed of a laminated film of said n-type silicon film and said conductive film, and forming a gate electrode of p-channel type MISFET, which is composed of a laminated film of said p-type silicon film and said conductive film; and
   (e) performing a heat treatment of said semiconductor substrate at a temperature of 700° C or higher after said step (d);
   wherein a circuit formed over the semiconductor substrate includes a memory array, a sense amplifier disposed at a periphery of said memory array, and a sub word driver, and further includes a DRAM provided with a memory array associate circuit for directly controlling said memory array and a peripheral circuit for controlling said memory array associate circuit,
   the memory array of said DRAM has a memory cell including a said n-channel type MISFET and a capacitor, and
   the peripheral circuit of said DRAM includes a said n-channel type MISFET and a said p-channel type MISFET.

2. The method of manufacturing a semiconductor integrated circuit device according to claim 1,
   wherein the gate electrode of said n-channel type MISFET and the gate electrode of said p-channel type MISFET of the peripheral circuit of said DRAM are electrically connected through a wiring formed on a same wiring layer as a bit line connecting said memory cell and said sense amplifier.

3. The method of manufacturing a semiconductor integrated circuit device according to claim 1,
   wherein the memory array associate circuit of said DRAM includes a said n-channel type MISFET and a said p-channel type MISFET, each having a gate electrode formed of a laminated film of said n-type silicon layer and said conductive film.

4. A method of manufacturing a semiconductor integrated circuit device, which forms an n-channel type MISFET and a p-channel type MISFET over a semiconductor substrate, the method comprising the steps of:
   (a) forming a gate dielectric film over a main surface of said semiconductor substrate, and thereafter forming a silicon film over said gate dielectric film;
   (b) introducing a plurality of kinds of impurities into said silicon film, and thereby defining one portion of said silicon film as a n-type silicon film and the other portion as a p-type silicon film;

(c) forming, above each of said n-type silicon film and said p-type silicon film, a conductive film containing tungsten or tungsten silicide as a main component;

(d) patterning said conductive film, said n-type silicon film, and said p-type silicon film after said step (c), and thereby forming a gate electrode of n-channel type MISFET, which is composed of a laminated film of said n-type silicon film and said conductive film, and forming a gate electrode of p-channel type MISFET, which is composed of a laminated film of said p-type silicon film and said conductive film; and (e) performing a heat treatment of said semiconductor substrate at a temperature of 700° C or higher after said step (d);

(f) forming a dielectric film over said semiconductor substrate so as to cover said gate electrodes, and forming a connection hole in said dielectric film above said gate electrodes; and (g) forming a wiring above said dielectric film, and electrically connecting said wiring and said gate electrodes through said connection hole;

wherein a circuit formed over said semiconductor substrate includes a SRAM, and the gate electrode of said n-channel type MISFET and the gate electrode of said p-channel type MISFET are electrically connected through a wiring formed on a same wiring layer as a wiring connected between a pair of storage nodes in a memory cell of said SRAM.

5. A method of manufacturing a semiconductor integrated circuit device, which forms an n-channel type MISFET and a p-channel type MISFET over a semiconductor substrate, the method comprising the steps of:

(a) forming a gate dielectric film over a main surface of said semiconductor substrate, and thereafter forming a silicon film over said gate dielectric film;

(b) introducing a plurality of kinds of impurities into said silicon film, and thereby defining one portion of said silicon film as a n-type silicon film and the other portion as a p-type silicon film;

(c) forming, above each of said n-type silicon film and said p-type silicon film, a conductive film containing tungsten or tungsten silicide as a main component;

(d) patterning said conductive film, said n-type silicon film, and said p-type silicon film after said step (c), and thereby forming a gate electrode of n-channel type MISFET, which is composed of a laminated film of said n-type silicon film and said conductive film, and forming a gate electrode of p-channel type MISFET, which is composed of a laminated film of said p-type silicon film and said conductive film; and (e) performing a heat treatment of said semiconductor substrate at a temperature of 700° C or higher after said step (d);

wherein a circuit formed over said semiconductor substrate includes a memory circuit and a logic circuit, and said logic circuit is composed of said n-channel type MISFET and said p-channel type MISFET.

6. The method of manufacturing a semiconductor integrated circuit device according to claim 5, wherein said memory circuit includes a DRAM and a SRAM, and a bit line connecting a memory cell and a sense amplifier of said DRAM is formed on a same wiring layer as a wiring connected between a pair of storage nodes in the memory cell of said SRAM.

7. The method of manufacturing a semiconductor integrated circuit device according to claim 6, wherein a gate electrode of said n-channel type MISFET and a gate electrode of said p-channel type MISFET, which constitute said logic circuit, are electrically connected through a wiring formed on the same wiring layer as said bit line connecting the memory cell and the sense amplifier of said DRAM and said wiring connected between said pair of storage nodes in the memory cell of said SRAM.

* * * * *